United States Patent
Hong et al.

(10) Patent No.: US 8,278,645 B2
(45) Date of Patent: Oct. 2, 2012

(54) LIGHT EMITTING DIODE AND FABRICATION THEREOF

(75) Inventors: Tzu Chien Hong, Kaohsiung (TW); Chia Hui Shen, Tainan (TW); Chih Pang Ma, Taoyuan County (TW); Chih Peng Hsu, Tainan County (TW); Shih Hsiung Chan, Sinfong Township (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 533 days.

(21) Appl. No.: 12/503,714

(22) Filed: Jul. 15, 2009

(65) Prior Publication Data
US 2010/0012962 A1  Jan. 21, 2010

(30) Foreign Application Priority Data
Jul. 17, 2008 (TW) ............... 97127080 A

(51) Int. Cl.
*H01L 27/15* (2006.01)

(52) U.S. Cl. ............ 257/13; 257/79; 257/E33.067; 438/22

(58) Field of Classification Search .............. 257/13
See application file for complete search history.

(56) References Cited

U.S. PATENT DOCUMENTS

| | | | |
|---|---|---|---|
| 4,570,172 A | 2/1986 | Henry et al. | |
| 5,237,581 A | 8/1993 | Asada et al. | |
| 5,376,580 A | 12/1994 | Kish et al. | |
| 6,784,462 B2 | 8/2004 | Schubert | |
| 6,797,987 B2 | 9/2004 | Chen et al. | |
| 7,335,924 B2 | 2/2008 | Liu et al. | |
| 7,834,373 B2 * | 11/2010 | Feng et al. | 257/99 |
| 2003/0111667 A1 * | 6/2003 | Schubert | 257/98 |
| 2003/0164503 A1 | 9/2003 | Chen | |
| 2004/0041164 A1 | 3/2004 | Thibeault et al. | |
| 2005/0205886 A1 | 9/2005 | Murofushi et al. | |
| 2008/0173885 A1 | 7/2008 | Kuromizu | |
| 2008/0315220 A1 * | 12/2008 | Lee et al. | 257/94 |

FOREIGN PATENT DOCUMENTS

| | | |
|---|---|---|
| JP | 2005-513787 A | 5/2005 |
| JP | 2006-245058 A | 9/2006 |
| JP | 2007-221029 A | 8/2007 |

OTHER PUBLICATIONS

"Stress behavior of electrodeposited copper films as mechanical supporters for light emitting diodes" published in "LED R&D Lab., LG Electronics Institute of Technology: Electrochimica Acta 52(2007) 5258-5265".

* cited by examiner

*Primary Examiner* — Ajay K Arora
(74) *Attorney, Agent, or Firm* — Altis Law Group, Inc.

(57) ABSTRACT

A light emitting diode is disclosed, wherein the light emitting diode comprises a metal reflective layer for enhancing the light reflection efficiency inside the light emitting diode and reducing the resistance to avoid the power loss. In addition, the light emitting diode further comprises a buffer layer sandwiched between the metal reflective layer and a semiconductor layer, wherein the buffer layer is mixed with metal and non-metallic transparent material for reducing the stress between the semiconductor and the metal to decrease the possibility of the die cracking.

7 Claims, 5 Drawing Sheets

LIGHT EMITTING DIODE AND FABRICATION THEREOF

BACKGROUND OF THE INVENTION

1. Field of the Invention

The present invention relates to a light emitting diode.

2. Description of the Related Art

The conventional light emitting diode comprises a semiconductor substrate, a light emitting structure on the semiconductor substrate, and two ohmic contact electrodes, wherein the two ohmic contact electrodes are respectively formed on the light emitting structure and on another side of the semiconductor substrate.

In general, the light emitting structure is composed of multilayer group III-V compound semiconductor with aluminum (Al), such as AlGaAs emitting infrared and red light, and AlGaInP emitting yellow-green, yellow, and red light. The light emitting structure emits light in all directions, i.e., it is isotropic. However, the bandgap energy of the substrate is usually less than the energy of the visible light, so the substrate absorbs most of the light emitted by the light emitting structure, which reduces the external quantum efficiency significantly, and reduces the brightness of the light emitting diode accordingly.

A variety of methods are provided to avoid light absorption by the substrate. In addition to the conventional method of interposing the light emitting structure on the substrate between the upper and lower distributed Bragg reflectors (DBRs), U.S. Pat. No. 4,570,172 and U.S. Pat. No. 5,237,581 also disclosed related modified structures. Use of the DBR structure causes the light emitted by the light emitting structure to be reflected when it emits to the substrate, thereby solving the problem of the light absorption by the substrate. However, the DBRs have a high reflective rate only if the incident light enters vertically, and with the increasing incidence angle of the light, the reflective rate is reduced accordingly. Therefore, even when using the DBRs, the external quantum efficiency of the light emitting diode and the ability to increase the brightness are still limited.

U.S. Pat. No. 5,376,580 provides another two methods using wafer bonding technology. The first method involves growing an epitaxial structure of the light emitting diode on a GaAs substrate, and then mounting the epitaxial structure of the light emitting diode to a transparent substrate using wafer bonding technology. The second method involves growing an epitaxial structure of the light emitting device on a GaAs substrate, and then mounting the epitaxial structure of the light emitting diode to a reflective mirror using wafer bonding technology. The above two methods increase the external quantum efficiency of the light emitting diode by removing the GaAs substrate which absorbs the light, wherein the first method uses a transparent substrate to transmit light, and the second method uses a reflective mirror to reflect light. However, the problem of using the transparent substrate in the first method is that the wafer bonding technology should proceed at a high annealing temperature, which results in the redistribution of the dopant among the wafer and reducing the efficiency of the light emitting diode. The problem with using the reflective mirror in the second method is that the reflective surface of the reflective mirror is used to connect directly during the wafer bonding process, which causes the reflective surface to become rough or deteriorated and degrades the reflective surface of the reflective mirror.

U.S. Pat. No. 6,797,987 also provides a light emitting diode using a reflective metal layer by interposing a transparent electrical-conductive oxide layer of an ITO layer between the reflective metal layer and a light emitting structure, so that the reflective metal layer will not function with the light emitting structure during the wafer bonding process. To improve the ohmic contact between the ITO layer and the light emitting structure, the structure of the above patent forms an ohmic contact grid pattern or channels in the ITO layer, or forms an alloy metal mesh between the ITO layer and the light emitting structure. Due to the complicated process of such structure, the manufacturing cost is high. The alloy metal mesh requires a high temperature alloy process and is very difficult to etch the alloy metal being a mesh shape. In addition, a thickness of the alloy metal should be considered: if the alloy metal layer is too thin, then the ohmic contact between the alloy metal and the light emitting structure is poor, while if the alloy metal layer is too thick, the adhesion force after the wafer bonding is weak.

For enhancing the light extraction efficiency of a conventional light emitting diode, U.S. Pat. No. 7,335,924 provides a light emitting diode with a reflective layer. The light emitting diode comprises a light emitting structure, a non-alloy ohmic contact layer sequentially formed on the light emitting structure, a first reflective layer, and a substrate. The major characteristics of the invention lie in a joint effect provided by the non-alloy ohmic contact layer and the first reflective layer so as to solve the problem of light absorption by the substrate. The first reflective layer functions as a reflective mirror and is made of a pure metal or a metal nitride for superior reflectivity. The non-alloy ohmic contact layer is interposed between the light emitting structure and the first reflective layer and the material used for the non-alloy ohmic contact layer can be optically transparent. However, the optically transparent conductive material usually has a higher resistance or a lower light transmittance.

U.S. Patent Publication No. 20050205886 provides a light emitting diode having a transparent penetrating reflective layer. In general, the light transmittance of the transparent penetrating reflective layer is lower than other reflective layer types, resulting in a reduced reflective rate of the light inside the light emitting diode. In addition, the transparent penetrating reflective layer also has a higher coefficient of expansion which is disadvantageous to the manufacture of the light emitting diode, thus reducing the yield rate.

U.S. Patent Publication No. 20040041164 provides a light emitting diode whose major characteristic is that the light emitting diode comprises a light extraction array as a reflective structure, wherein the light extraction array is arranged on a substrate of the light emitting diode. When light is incident to the substrate through the light extraction array, the light can be reflected. However, such reflection requires a total reflection and has a limitation, i.e., the effect is not the same as the direct reflection by metal.

In addition, a paper entitled "Stress behavior of electrodeposited copper films as mechanical supporters for light emitting diodes" published in "LED R&D Lab., LG Electronics Institute of Technology: Electrochimica Acta 52 (2007) 5258-5265" joins a metal and a semiconductor directly. In this method, the inner stress is not released, causing the chip to warp and crack.

SUMMARY OF THE INVENTION

Based on the above-mentioned prior art, in order to meet requirements of the industry, the present invention proposes a light emitting diode for solving the problems of the above conventional light emitting diode.

An aspect of the present invention is to provide a light emitting diode, wherein a light emitting structure is formed on a substrate. The light emitting structure comprises a first semiconductor layer and a second semiconductor layer, wherein the first semiconductor layer and the second semiconductor layer are arranged on bilateral sides of the light emitting structure. First, a dielectric layer is formed on the first semiconductor layer, and a photoresist is arranged on the dielectric layer. The dielectric layer is etched through the photoresist to provide a plurality of voids, and therefore a plurality of the dielectric material structures is formed. Alternatively, the photoresist is arranged on the first semiconductor layer, and then a plurality of dielectric material structures are deposited on the first semiconductor layer through a plurality of voids of the photoresist. The photoresist is removed to form a plurality of voids between the plurality of dielectric material structures, wherein a dielectric material array is composed of the plurality of dielectric material structures. Next, a metal material array is composed by forming a plurality of metal material structures in the plurality of voids, and the plurality of the metal material structures and the plurality of the dielectric material structures are interlaced with each other to form the buffer layer. Next, a reflective layer is formed on the buffer layer.

After implementing the above structure, a substitute substrate is formed on the reflective layer to replace the original substrate of the light emitting diode. The original substrate of the light emitting device is separated to form a contact electrode on the second semiconductor layer.

BRIEF DESCRIPTION OF THE DRAWINGS

The invention will be described according to the appended drawings in which.

DETAILED DESCRIPTION OF THE INVENTION

Figure 1A:
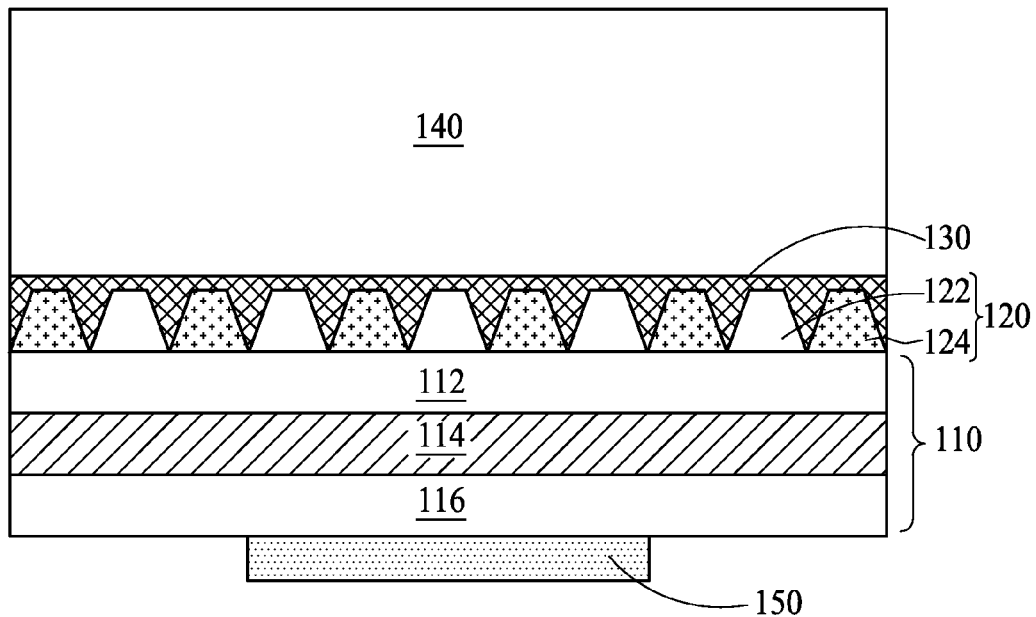
FIG. 1A is a diagram showing a cross section of a tight emitting diode.

In this invention, a light emitting device and fabrication thereof is disclosed. Detailed steps and compositions are described below in order that this invention can be thoroughly understood. The embodiments of the invention do not limit the details, with which persons skilled in the field of light emitting devices and fabrication thereof should be familiar. On the other hand, well known compositions and steps are not described in detail to avoid unnecessary limitations of the invention. Preferred embodiments are described in detail as follows. In addition to these detailed descriptions, this invention can also be implemented widely in other embodiments. In addition, the scope of the present invention is not to be taken in a limiting sense, and is defined only by the appended claims.

The present invention provides a light emitting device comprising a metal reflective layer for increasing the reflective efficiency inside the light emitting diode and reducing the resistance and power consumption at the same time. In addition, the light emitting diode further comprises a buffer layer between the metal reflective layer and a semiconductor. The buffer layer is mixed with metal and non-metallic transparent material to reduce the stress between the semiconductor and the metal and thereby decrease the possibility of the die cracking.

The above structure is formed on a conventional light emitting diode, wherein the conventional light emitting diode is comprised of a light emitting structure on a substrate, and the light emitting structure comprises a dielectric layer and first and second semiconductor layers on bilateral sides of the reaction layer. First, a dielectric layer is formed on the first semiconductor layer. Next, a photoresist is arranged on the dielectric layer and the dielectric layer is etched through the photoresist to provide a plurality of voids, and a plurality of dielectric material structures is thereby formed. Alternatively, a photoresist is arranged on the first semiconductor layer to deposit a plurality of dielectric material structures on the first semiconductor layer through a plurality of voids of the photoresist. Next, the photoresist is removed to form a plurality of voids between the plurality of the dielectric material structures, wherein a dielectric material array is composed of the plurality of dielectric material structures. Next, a metal material array is composed by forming a plurality of metal material structures in the plurality of voids, and the plurality of the metal material structures and the plurality of the dielectric material structures are interlaced with each other to form the buffer layer. Next, a reflective layer is formed on the buffer layer.

Due to the interlaced arrangement of the plurality of metal material structures and the plurality of dielectric material structures, the coefficient of expansion of the buffer layer can be adjusted so that the dielectric material structure of the buffer layer can be used as an extension space when the metal encounters heat. In such way, the stress between the metal and the semiconductor is reduced, the probability of the die cracking is lowered and the production yield rate is improved. Moreover, the reflective layer can be a metal material for enhancing the light emitting efficiency due to the high reflective rate.

After implementing the above structure, a substitute substrate is formed on the reflective layer to replace the original substrate of the light emitting diode. The original substrate of the light emitting device is separated to form a contact electrode on the second semiconductor layer.

FIG. 1A is a diagram showing a cross section of the above-mentioned light emitting diode. The light emitting device comprises a light emitting structure 110, a buffer layer 120, a reflective layer 130, a substitute substrate 140, and a contact electrode 150. The light emitting structure 110 comprises a first semiconductor layer 112, a reaction layer 114, and a second semiconductor layer 116, wherein the first semiconductor layer 112 and the second semiconductor layer 116 are arranged on bilateral sides of the light emitting structure, and the reaction layer 114 is arranged between the first semiconductor layer 112 and the second semiconductor layer 116. The material of the first semiconductor layer 112 can be P—GaN, and the material of the second semiconductor layer 116 can be N—GaN.

Figure 1B:
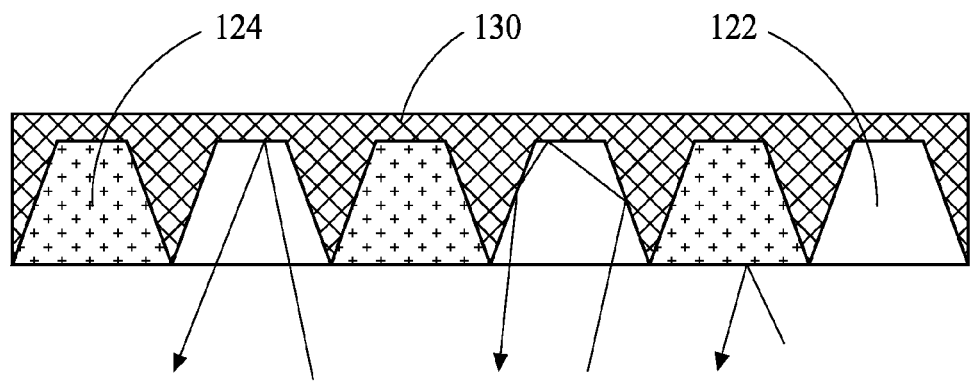
FIG. 1B is a diagram showing a cross section of the reflective structure of the light emitting diode.

The buffer layer 120 is arranged on the first semiconductor layer 112 and the buffer layer 120 comprises a plurality of dielectric material structures 122 and a plurality of metal material structures 124. The plurality of metal material structures 124 and the plurality of dielectric material structures 122 are arranged with spaces therebetween or arranged alternately. The reflective layer 130 is arranged on the buffer layer 120 and the shape of the side view of each of the dielectric material structures 122 can be a trapezoid so that the reflective layer 130 forms an inclined plane on the chamfer of the trapezoidal dielectric material structures 122 so as to reflect light, as shown in FIG. 1B. The material of the reflective layer 130 can be Al.

Figure 1C:
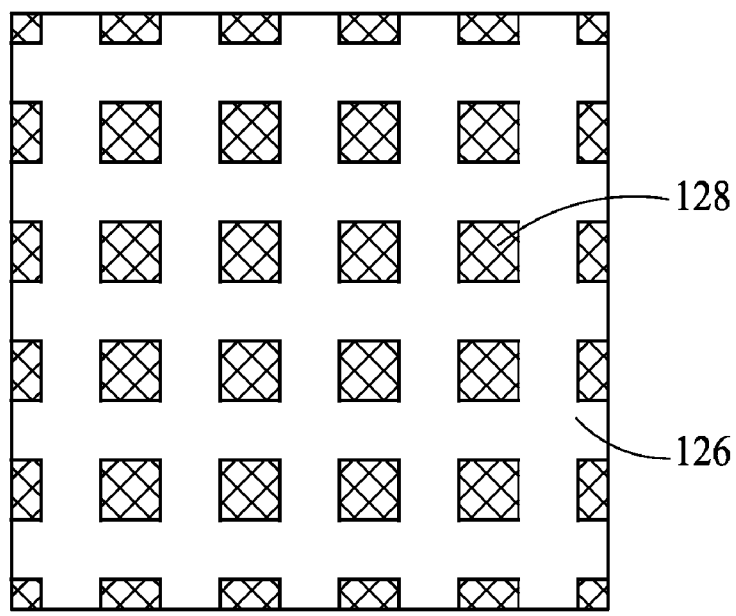
FIG. 1C is a top view showing the dielectric material array and the metal material array according to the first embodiment of the present invention.
Figure 1D:
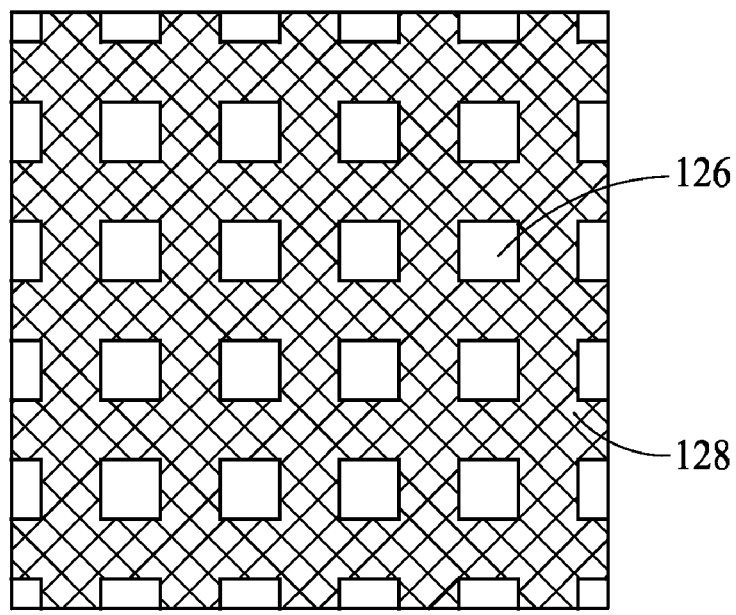
FIG. 1D is a top view showing the dielectric material array and the metal material array according to the second embodiment of the present invention.
Figure 1E:
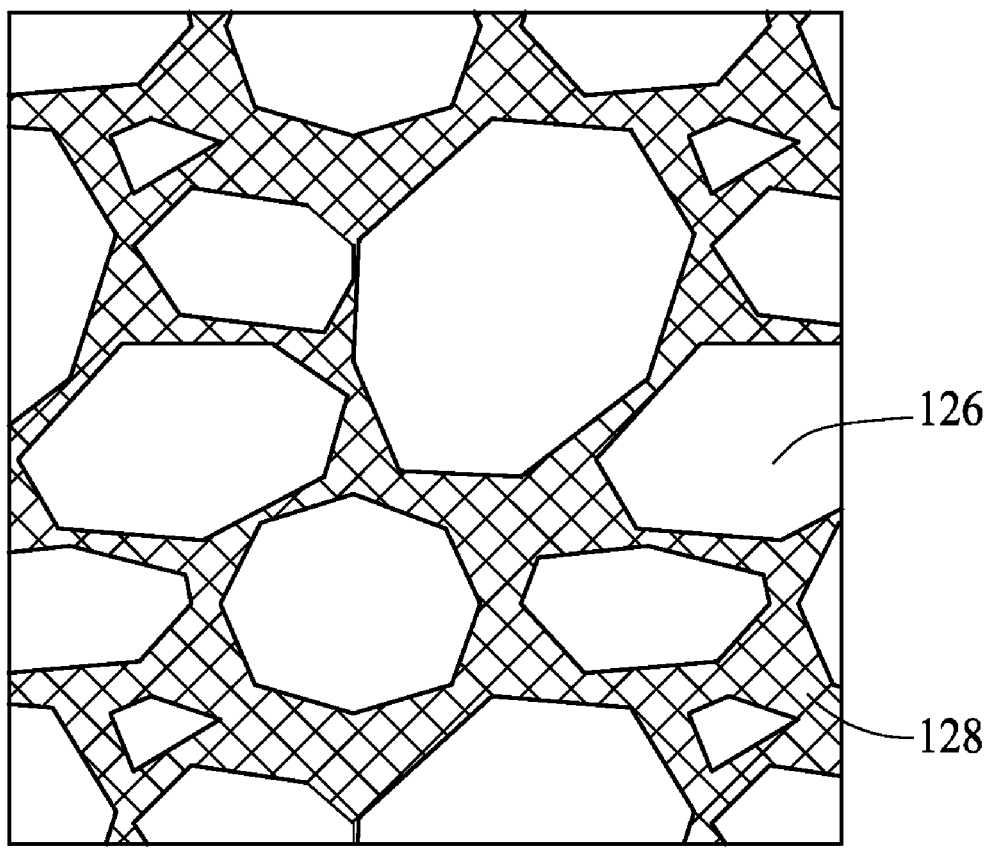
FIG. 1E is a top view showing the dielectric material array and the metal material array according to the third embodiment of the present invention.

Another embodiment of the buffer layer 120 comprises a dielectric material array 126 and a metal material array 128, wherein the metal material array 128 is arranged in a plurality of voids between said dielectric material array 126, and a plurality of interfaces of the reflective layer 130 and the dielectric material array 126 are a plurality of inclined planes to reflect light. As shown in FIG. 1C, the dielectric material array 126 can be a net structure and other voids are the metal material array 128. Moreover, the dielectric material array 126 can be an array with separated and distributed structure so that the metal material array 128 forms a net structure in the open space, as shown in FIG. 1D. Alternatively, the dielectric material array 126 and the metal material array 128 can be a structure with an irregular arrangement, as shown in FIG. 1E.

The dielectric material array 126 can be arranged by the plurality of the dielectric material structures 122. In the same way, the metal material array 128 can be arranged according to the plurality of the metal material structures 124. In addition, a thickness of the dielectric material structures 122 or the dielectric material array 126 is greater than or equal to one-sixth of a wavelength of a source of the light emitting diode, and a material of the dielectric material structures 122 and the dielectric material array 126 can be a light transmissive dielectric, such as air, SiO.sub.x, SiO.sub.xN.sub.y, diamond-like carbon, or diamond. The metal material structures 124 or the metal material array 128 is composed of a combination of Pt, Pd, Au, or a combination of Ni and Au. In a preferred embodiment of the present invention, the dielectric material structures 122 and the dielectric material array 126 are SiO.sub.2 and a ratio of the dielectric material structures 122 and the metal material structures 124, or a ratio of the dielectric material array 126 and the metal material array 128 is Pd/Pt/Au: SiO.sub.2=1:1.16.

Referring to FIG. 1A, the substitute substrate 140 is arranged on the reflective layer 130 to replace the original substrate of the light emitting structure 110, wherein the substitute substrate 140 can be Cu. In addition, the contact electrode 150 is arranged on the second semiconductor. The reflective structure composed of the buffer layer 120 and the reflective layer 130 can be used not only for the light emitting device, but also for other semiconductor devices with the same purpose of reflecting lights. The reflective structure is not limited to use in the light emitting device.

Figure 2:
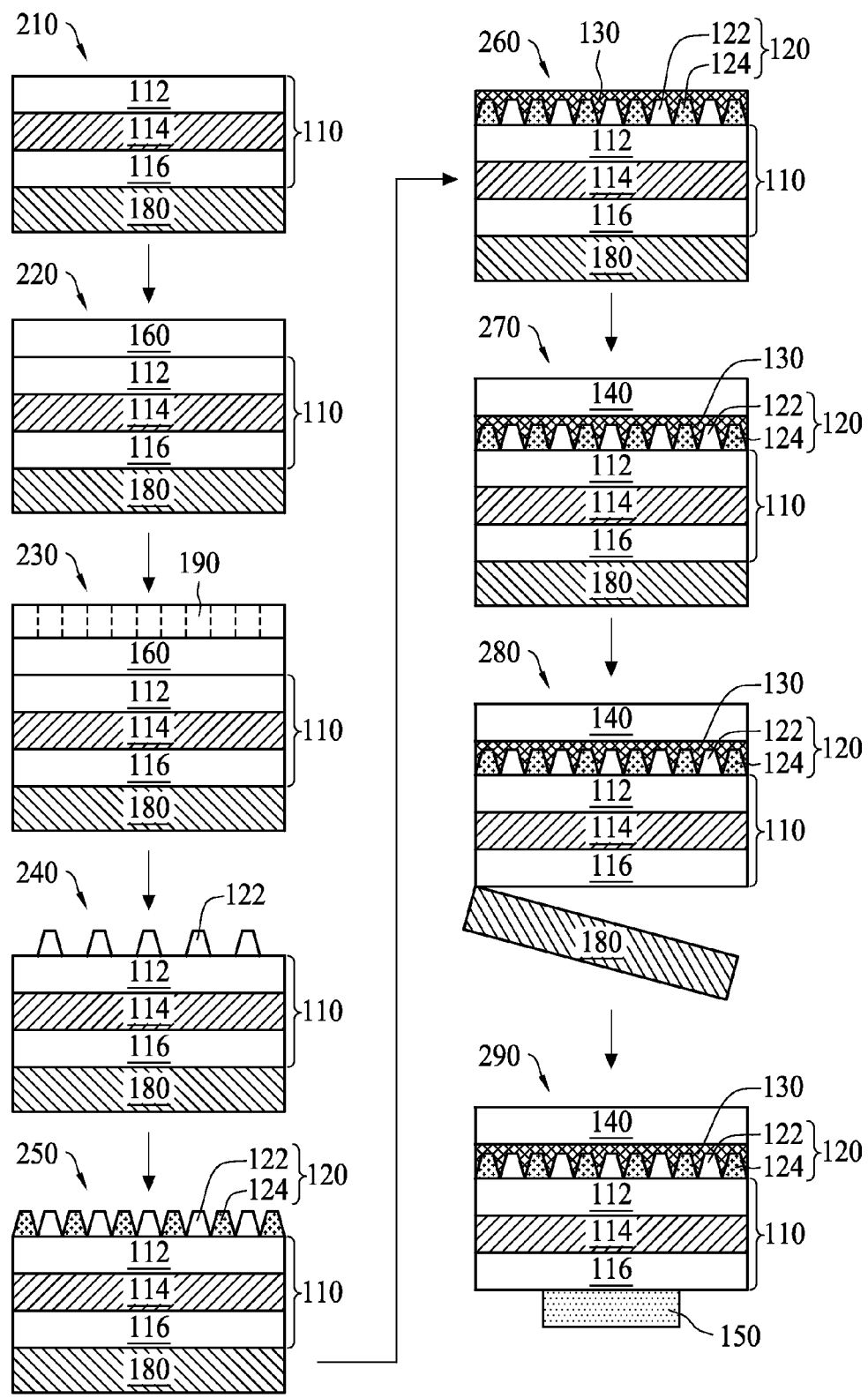
FIG. 2 is a diagram showing a method for fabricating a light emitting diode.

Referring to FIG. 2, the present invention further provides a method for fabricating a light emitting diode comprising the following steps. First, in step 210, a light emitting structure 110 of a light emitting diode is formed on a substrate 180. Next, in step 220, a dielectric layer 160 is formed on a first semiconductor layer 112 of the light emitting structure 110. Next, in step 230, a photoresist 190 is arranged on the dielectric layer 160 and then the dielectric layer 160 is etched through the photoresist 190 to provide a plurality of voids, and therefore a plurality of the dielectric material structures 122 are formed, as shown in step 240. Next, in step 250, a plurality of metal material structures 124 are formed in the plurality of voids, wherein the plurality of the metal material structures 124 and the plurality of the dielectric material structures 122 are arranged with spaces therebetween or arranged alternately. Next, a reflective layer 130 is formed on the plurality of the metal material structures 124 and the plurality of the dielectric material structures 122, as shown in step 260. In step 270, a substitute substrate 140 is formed on the reflective layer 130. Next, in step 280, the substrate 180 is separated. Finally, in step 290, a contact electrode 150 is formed on the second semiconductor layer 116, wherein the first semiconductor layer 112 and the second semiconductor layer 116 are arranged on bilateral sides of the light emitting structure 110.

The plurality of the metal material structures 124 can be formed by physical vapor deposition (PVD), and in the preferred embodiment of the present invention, the plurality of metal material structures 124 are formed by evaporation. The reflective layer 130 can be formed by evaporation, sputtering, chemical plating, electroplating, etc, and in the preferred embodiment of the present invention, the reflective layer 130 is formed by evaporation. Moreover, the method of separating the substrate 180 includes a laser or a chemical etching spalling.

Figure 3:
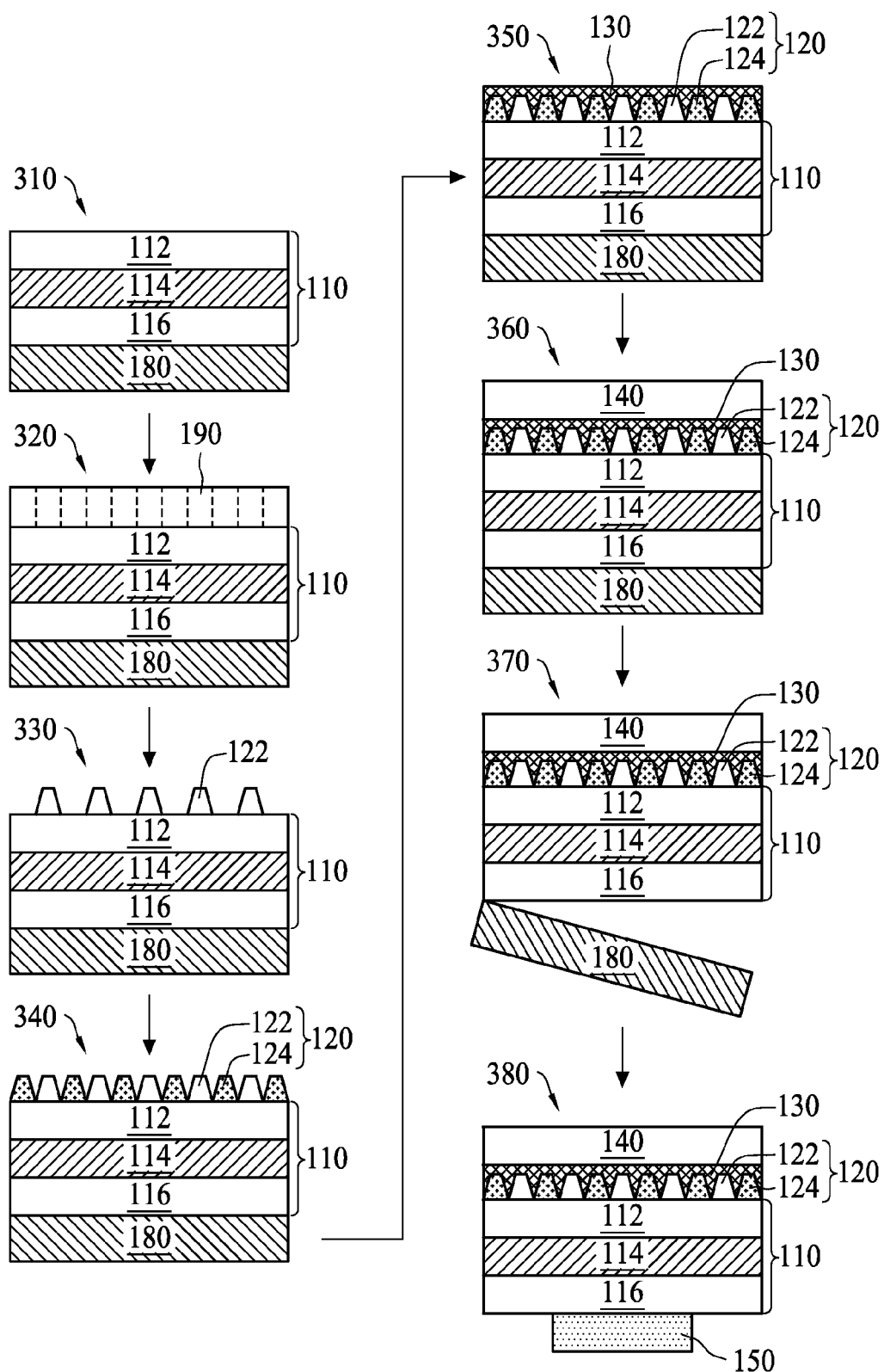
FIG. 3 is a diagram showing another method for fabricating a light emitting diode.

Referring to FIG. 3, the present invention further provides another method for fabricating a light emitting diode comprising the following steps. First, in step 310, a light emitting structure 110 of a light emitting diode is formed on a substrate 180. In step 320, a photoresist 190 is arranged on a first semiconductor layer 112 of the light emitting structure 110, and then a plurality of dielectric material structures 122 are deposited on the first semiconductor layer 112 through a plurality of voids of the photoresist 190. Next, in step 330, the photoresist 190 is removed to form a plurality of voids between the plurality of the dielectric material structures 122. Next, in step 340, a plurality of metal material structures 124 are formed in the plurality of voids, and the plurality of the metal material structures 124 and the plurality of the dielectric material structures 122 are arranged with spaces therebetween or arranged alternately. Next, a reflective layer 130 is formed on the plurality of the metal material structures 124 and the plurality of the dielectric material structures 122, as shown in step 350. In step 360, a substitute substrate 140 is formed on the reflective layer 130. Next, in step 370, the substrate 180 is separated. Finally, in step 380, a contact electrode 150 is arranged on the second semiconductor layer 116, wherein the first semiconductor layer 112 and the second semiconductor layer 116 are arranged on bilateral sides of the light emitting structure 110.

The plurality of the dielectric material structures can be formed by PVD or high density plasma chemical vapor deposition (HDP-CVD). In the same way, the plurality of the metal material structures 124 can be formed by PVD and in the preferred embodiment of the present invention, the plurality of metal material structures 124 are formed by evaporation. The reflective layer 130 can be formed by evaporation, sputtering, chemical plating, electroplating, etc, and in the preferred embodiment of the present invention, the reflective layer 130 is formed by evaporation. Moreover, the method of separating the substrate 180 includes a laser or a chemical etching spalling.

The above-described embodiments of the present invention are intended to be illustrative only. Numerous alternative embodiments may be devised by persons skilled in the art without departing from the scope of the following claims.

What is claimed is:

1. A light emitting diode, comprising:
 a light emitting structure comprising a first semiconductor layer and a second semiconductor layer arranged on bilateral sides of said light emitting structure;

a buffer layer arranged on said first semiconductor layer, wherein said buffer layer includes a plurality of dielectric material structures and a plurality of metal material structures alternate with each other, a cross sectional view of each dielectric material structure being trapezoid and comprising two inclined side surfaces which are inclined toward each other along a direction away from the light emitting structure; and a reflective layer arranged on said buffer layer to reflect a transmitting light by said dielectric material array, the reflective layer comprising a portion extending into said buffer layer, and positioned between two neighboring dielectric material structure and metal material structure, a cross sectional view of said portion being triangular.

2. The light emitting diode of claim 1, wherein a thickness of said dielectric material structures is greater than or equal to one-sixth of a wavelength of a light source of said light emitting diode.

3. The light emitting diode of claim 1, wherein a material of said metal material structures is a combination of Pt, Pd and Au or a combination of Ni and Au.

4. The light emitting diode of claim 1, further comprising a substitute substrate, wherein said substitute substrate is on said reflective layer.

5. A reflective structure of a semiconductor device, comprising:

a buffer layer configured to be arranged on a semiconductor layer of the semiconductor device, wherein said buffer layer includes a plurality of dielectric material structures and a plurality of metal material structures alternate with each other, a cross sectional view of each dielectric material structure being trapezoid and comprising two inclined side surfaces which are inclined toward each other along a direction away from the semiconductor layer, and a reflective layer arranged on said buffer layer to reflect a light transmitted by said dielectric material array, the reflective layer comprising a portion extending into the buffer layer and positioning between two neighboring dielectric material structure and metal material structure, a cross-sectional view of said portion being triangular.

6. The reflective structure of a semiconductor device of claim 5, wherein a thickness of said dielectric material structures is greater than or equal to one-sixth of a wavelength of a light source of said light emitting diode.

7. The reflective structure of a semiconductor device of claim 5, wherein a material of said metal material structures is a combination of Pt, Pd and Au or a combination of Ni and Au.

* * * * *